US008416005B2

United States Patent
Luo et al.

(10) Patent No.: US 8,416,005 B2
(45) Date of Patent: *Apr. 9, 2013

(54) MULTIFUNCTIONAL OUTPUT DRIVERS AND MULTIFUNCTIONAL TRANSMITTERS USING THE SAME

(75) Inventors: Yan-Bin Luo, Taipei (TW); Tun-Shih Chen, Pingtung County (TW); Min-Chung Chou, Toufen Township, Miaoli County (TW)

(73) Assignee: Mediatek Inc., Hsin-Chu (TW)

( * ) Notice: Subject to any disclaimer, the term of this patent is extended or adjusted under 35 U.S.C. 154(b) by 161 days.

This patent is subject to a terminal disclaimer.

(21) Appl. No.: 12/917,894

(22) Filed: Nov. 2, 2010

(65) Prior Publication Data

US 2011/0043259 A1  Feb. 24, 2011

Related U.S. Application Data

(62) Division of application No. 12/188,335, filed on Aug. 8, 2008, now Pat. No. 7,965, 121.

(60) Provisional application No. 61/018,680, filed on Jan. 3, 2008.

(51) Int. Cl.
    *H03L 5/00* (2006.01)
(52) U.S. Cl. .......................... 327/333; 327/108; 327/112
(58) Field of Classification Search .................. 327/333; 326/68, 80, 81; 365/189.11
    See application file for complete search history.

(56) References Cited

U.S. PATENT DOCUMENTS

| | | | |
|---|---|---|---|
| 5,226,012 A | 7/1993 | Amano et al. | |
| 5,592,629 A | 1/1997 | Gamble | |
| 6,531,896 B1 | 3/2003 | Song | |
| 6,865,241 B1 | 3/2005 | Adkins et al. | |
| 7,228,116 B2 | 6/2007 | Cheng et al. | |
| 7,256,624 B2 | 8/2007 | Chen et al. | |
| 7,256,625 B2 | 8/2007 | Liu et al. | |
| 7,310,396 B1 | 12/2007 | Sabih | |
| 7,538,588 B2 * | 5/2009 | Liu et al. | 327/108 |

(Continued)

FOREIGN PATENT DOCUMENTS

| | | |
|---|---|---|
| CN | 1959801 | 5/2007 |
| CN | 1971704 | 5/2007 |

OTHER PUBLICATIONS

English language translation of abstract of CN 1971704 (published May 30, 2007).

*Primary Examiner* — Long Nguyen
(74) *Attorney, Agent, or Firm* — McClure, Qualey & Rodack, LLP

(57) ABSTRACT

A multifunctional output driver capable of transmitting signals of different interfaces in different modes is provided, in which first and second current sources are provided, and first to fourth switching devices are coupled between the first and second current sources, and the first and second current source and the first to the fourth switching devices act as a current steering circuit. In a first transmission mode, the first and second switching devices are turned off, and the third and fourth switching devices and the first current source act as a current mode logic circuit to provide an output signal compatible with a first transmission interface according to an input signal from a pre-driver. In a second transmission mode, the current steering circuit outputs an output signal compatible with a second transmission interface according to the input signal from the pre-driver.

13 Claims, 5 Drawing Sheets

U.S. PATENT DOCUMENTS 7,597,881 B2    10/2009  Gruning et al.
7,965,121 B2 *   6/2011  Luo et al. ..................... 327/333
2005/0088428 A1  4/2005  Liu et al.
2007/0103349 A1  5/2007  Liu et al.
2007/0127518 A1  6/2007  Liu et al.
2008/0068683 A1  3/2008  Kanno

* cited by examiner

MULTIFUNCTIONAL OUTPUT DRIVERS AND MULTIFUNCTIONAL TRANSMITTERS USING THE SAME

CROSS REFERENCE TO RELATED APPLICATIONS

This application is a Divisional of application Ser. No. 12/188,335, filed Aug. 8, 2008, now U.S. Pat. No. 7,965,121, which claims the benefit of provisional Application No. 61/018,680, filed Jan. 3, 2008.

BACKGROUND OF THE INVENTION

1. Field of the Invention

The invention relates to output drivers, and more particularly, to multifunctional output drivers capable of transmitting signals of different specifications in different modes.

2. Description of the Related Art

Low voltage differential signaling, or LVDS, is an electrical signaling system that can run at very high speeds over twisted-pair copper cables. LVDS is a differential signaling system, which means that it transmits two different voltages which are compared at the receiver. LVDS uses the difference in voltage between the two wires to encode information. The transmitter injects a small current, nominally 3.5 mA, into one wire or the other, depending on the logic level to be sent. The current passes through a resistor of about 100 to 120Ω at the receiving end, and then returns in the opposite direction along the other wire. From Ohm's law, the voltage difference across the resistor is therefore about 350 mV. The receiver senses the polarity of this voltage to determine the logic level. This type of signaling is called a current loop. The small amplitude of the signal and the tight electric- and magnetic-field coupling between the two wires reduces the amount of radiated electromagnetic noise.

Current-mode logic (CML) circuits are commonly used in applications where maximum operational speed is desired. CML circuits use differential low-voltage signaling and have constant power consumption. A CML gate consists of a dc current source, a differential load and a switching network, composed of either MOSFETs or bipolar transistors, which connect the current source to the differential load. The transmission is point-to-point, unidirectional and is usually terminated at the destination with 50Ω resistors to Vcc on both links.

Because different display panels require different transmission interfaces, there is a need for a multifunctional output driver capable of transmitting signals of different interfaces in different modes in order to reduce costs and power consumption.

BRIEF SUMMARY OF THE INVENTION

Embodiments of a multifunctional output driver are provided, in which a first differential unit is coupled to a pair of transmission terminals, wherein the first differential unit is enabled in a first transmission mode to serve as a first driver to output an output signal compatible with a first transmission interface according to an input signal from a pre-driver. Meanwhile, a second differential unit is coupled to the transmission terminals and the first differential unit, wherein the second differential unit is disabled in the first transmission mode, and the first and second differential units are both enabled in a second transmission mode to serve as a second driver for outputting an output signal compatible with a second transmission interface according to the input signal from the pre-driver.

The invention also provides an embodiment of a multifunctional transmitter, in which a pre-driver is powered by a first power voltage, and a multifunctional output driver is powered by a first power voltage exceeding the first power voltage. The multifunction output driver comprises a first differential unit enabled in the first transmission mode to output the output signal compatible with a first transmission interface to a pair of transmission terminals according to an input signal from the pre-driver, and a second differential unit disabled in the first transmission mode. The first and second differential units are both enabled in the second transmission mode to output the output signal compatible with a second transmission interface to the transmission terminals according to the input signal from the pre-driver.

The invention provides an embodiment of a multifunctional output driver, in which a first current source is coupled between a power voltage and a first node, a first differential pair is coupled between the first node and a pair of transmission terminals, a second differential pair is coupled between a second node and the pair of transmission terminals, and a second current source is coupled between the second node and a ground voltage. The first differential pair is disabled and the second differential pair and the second current source act a first output driver to output an output signal compatible with a first transmission interface according to an input signal from a pre-driver in a first transmission mode. In addition, the first and second current sources and the first and second differential pairs act a second output driver to output an output signal compatible with a second transmission interface according to the input signal from the pre-driver in a second transmission mode.

The invention also provides an embodiment of a multifunctional transmitter, in which a pre-driver and a multifunctional output driver are provided. The multifunctional output driver comprising a first current source coupled between a power voltage and a first node, a first differential pair is coupled between the first node and a pair of transmission terminals, a second differential pair is coupled between a second node and the pair of transmission terminals, and a second current source is coupled between the second node and a ground voltage. In a first transmission mode, the first differential pair is disabled, and the second differential pair and the second current source act as a first output driver to output an output signal compatible with a first transmission interface according to an input signal from a pre-driver. In a second transmission mode, the first and second current sources and the first and second differential pairs act as a second output driver to output an output signal compatible with a second transmission interface according to the input signal from the pre-driver.

The invention provides an embodiment of a multifunctional output driver, in which first and second current sources are provided, and first to fourth switching devices are coupled between the first and second current sources, and the first and second current source and the first to the fourth switching devices act as a current steering circuit. In a first transmission mode, the first and second switching devices are turned off, and the third and fourth switching devices and the first current source act as a current mode logic circuit to provide an output signal compatible with a first transmission interface according to an input signal from a pre-driver. In a second transmission mode, the current steering circuit outputs an output signal compatible with a second transmission interface according to the input signal from the pre-driver.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
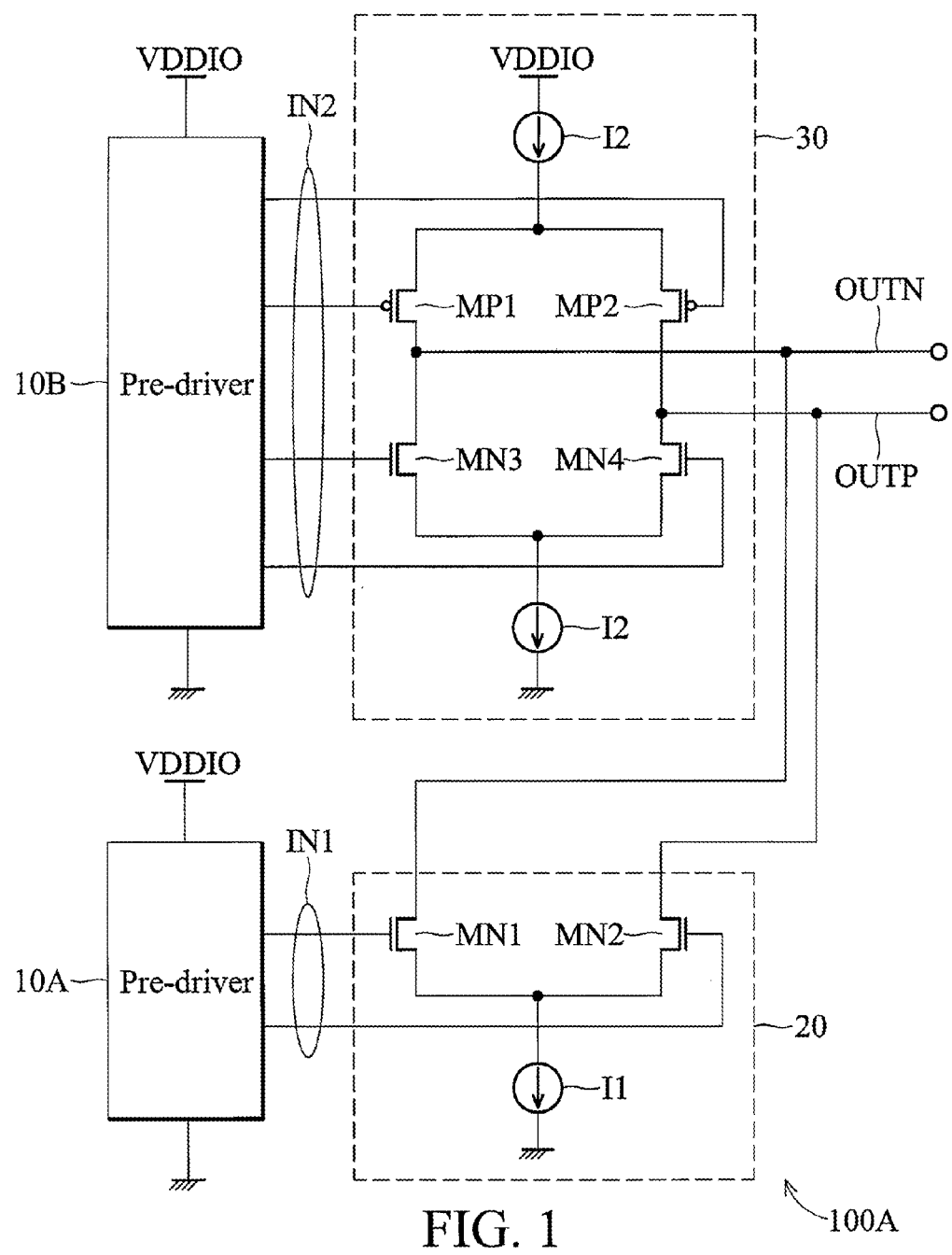
FIG. 1 is a schematic diagram of an embodiment of a multifunctional transmitter.

FIG. 1 is a schematic diagram of an embodiment of a multifunctional transmitter. As shown, a multifunction transmitter 100A comprises two pre-drivers 10A and 10B and two output drivers 20 and 30 for outputting signals compatible with a first transmission interface in a first transmission mode and signals compatible with a second transmission interface in a second transmission mode. The first transmission interface and the second transmission interface can, for example, be a low voltage differential signaling (LVDS) transmission interface and a current mode logic (CML) transmission interface, respectively, but is not limited thereto. The pre-drivers 10A and 10B and the output driver 30 are powered by a power voltage VDDIO and are implemented by thick-oxide devices. For example, the power voltage VDDIO is an input/output (I/O) power voltage, such as a 3.3V, 5V, 12V and so on I/O power voltage, but is not limited thereto.

The pre-driver 10A is enabled to provide an input signal IN1 to the output driver 20 in the first transmission mode according to a signal from a front-end, such as a serializer (not shown), and the pre-driver 10A is disabled in the second transmission mode. On the contrary, the pre-driver 10B is enabled to provide an input signal IN2 to the output driver 30 in the second transmission mode according to a signal from the front-end (not shown), and the pre-driver 10B is disabled in the first transmission mode. Namely, the pre-drivers 10A and 10B are enabled in the first and second transmission modes, respectively.

The output driver 20 comprises MOS transistors MN1 and MN2 and a current source I1, and the output driver 20 outputs signals compatible with the first transmission interface to a pair of transmission terminals OUTN and OUTP according to the input signal IN1 from the pre-driver 10A in the first transmission mode. In the second transmission mode, the output diver 20 is disabled by the pre-driver 10A.

The output driver 30 comprises MOS transistors MN3-MN4 and MP1-MP2 and two current sources I2 and I3, and the output driver 30 outputs signals compatible with the second transmission interface to the transmission terminals OUTN and OUTP according to the input signal IN2 from the pre-driver 10B in the second transmission mode. Similarly, the output diver 30 is disabled by the pre-driver 10B in the first transmission mode.

However, the multifunction transmitter 100A occupancies a larger chip area because it requires two sets of output drivers and pre-drivers to implement transmitting signals of different specifications in different transmission modes. Moreover, because the pre-drivers are powered by an I/O power voltage, they have large power consumption and have to be implemented by thick-oxide devices, thus, requiring a large chip area.

Figure 2:
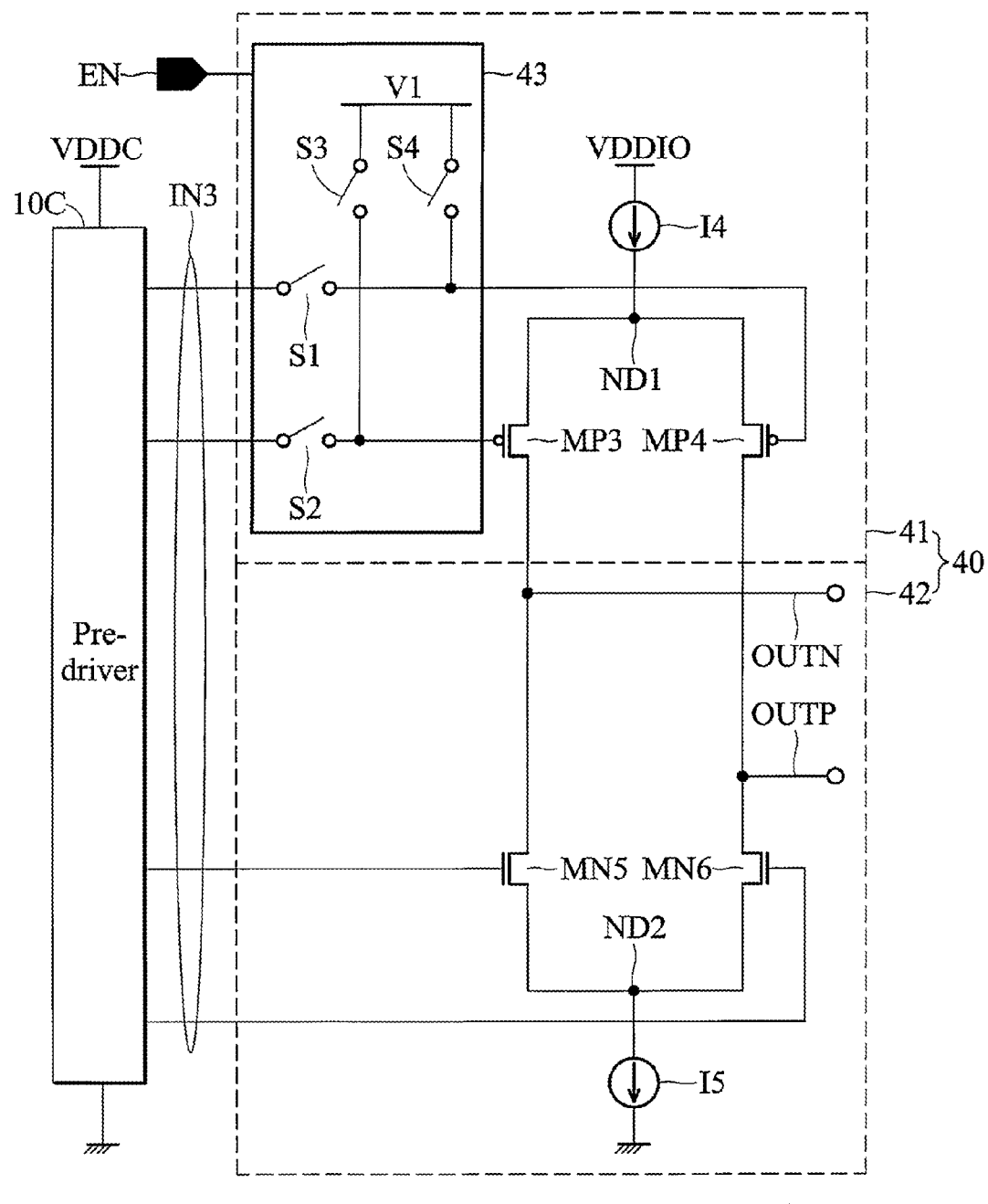
FIG. 2 shows another embodiment of a multifunctional transmitter.

FIG. 2 shows another embodiment of the multifunctional transmitter. As shown, the multifunctional transmitter 100B comprises a pre-driver 10C powered by a power voltage VDDC and a multifunctional output driver 40 powered by the power voltage VDDIO, wherein the power voltage VDDC is smaller than the power voltage VDDIO. The power voltage VDDC can, for example, be a core power voltage, such as a 1.2V, 1.0V and so on core power voltage, but is not limited thereto. The multifunctional transmitter 100B outputs signals compatible with the first transmission interface in the first transmission mode and outputs signals compatible with the second transmission interface in the second transmission mode.

The pre-driver 10C provides an input signal IN3 to the multifunctional output driver 40 in both the first and second transmission modes according to a signal from the front-end (not shown). Namely, the pre-driver 10C is shared in both the first and second transmission modes. The multifunctional output driver 40, according to the input signal IN3, outputs signals compatible with the first transmission interface to the transmission terminals OUTN and OUTP in the first transmission mode, and outputs signals compatible with the second transmission interface to the transmission terminals OUTN and OUTP in the second transmission mode. The multifunctional output driver 40 comprises current sources I4 and I5, MOS transistors MP3, MP4, MN5 and MN6 and a switching circuit 43, in which the current sources I4 and I5 and the MOS transistors MP3, MP4, MN5 and MN6 are connected as a current steering circuit. The multifunctional output driver 40 is divided into two differential units 41 and 42, in order to transmit signals compatible with the first and second transmission interfaces in the first and second transmission modes.

In the first transmission mode, the differential unit 41 is disabled, such that only the differential unit 42 is enabled to serve as a first output driver to output signals compatible with the first transmission interface according to the input signal IN3 from the pre-driver 10C. On the contrary, in a second transmission mode, the differential units 41 and 42 are both enabled to serve as a second output driver for outputting signals compatible with the second transmission interface according to the input signal IN3. As shown, the current source I4, the MOS transistors MP3 and MP4 and the switching circuit 43 are regarded as a differential unit 41, and the current source I5 and the MOS transistors MN5 and MN6 are regarded as another differential unit 42.

The current source I4 is coupled between the power voltage VDDIO and a node ND1, the MOS transistor MP3 comprises a first terminal coupled to the node ND1, a second terminal coupled to the transmission terminal OUTN and a control terminal coupled to the switching circuit 43, and the MOS transistor MP4 comprises a first terminal coupled to the node ND1, a second terminal coupled to the transmission terminal OUTP and a control terminal coupled to the switching circuit 43. The MOS transistors MP3 and MP4 are implemented as a differential pair, and the control terminals of the MOS transistors MP3 and MP4 serve as input terminals of the differential pair, and the second terminals of the MOS transistors MP3 and MP4 serve as output terminals of the differential pair.

The switching circuit 43 is coupled between the control terminals of MOS transistor MP3 and MP4 and the pre-driver 10C. The switching circuit 43 comprises switching devices S1, S2, S3 and S4 to selectively disable the differential unit 41 according to an enabling signal EN. The switching device S1 is coupled between the pre-driver 10C and the control terminal of the MOS transistor MP4, the switching device S2 is coupled between the pre-driver 10C and the control terminal of the MOS transistor MP3, the switching device S3 is coupled between a voltage V1 and the control terminal of the MOS transistor MP3, and the switching device S4 is the voltage V1 and the control terminal of the MOS transistor MP4. The voltage V1 can be a constant voltage capable of turning off the MOS transistors MP3 and MP4, for example, the voltage V1 can be equal to the power voltage VDDIO, but is not limited thereto.

When the enabling signal EN is activated, the switching devices S1 and S2 are turned on and the switching devices S3 and S4 are turned off, such that the MOS transistors MP3 and MP4 can be controlled by the input signal IN3. On the contrary, when the enabling signal EN is deactivated, the switching devices S1 and S2 are turned off and the switching devices S3 and S4 are turned on, such that the control terminals of the MOS transistors MP3 and MP4 are electrically isolated from the pre-driver 10C and are pulled to the voltage V1. Hence, the MOS transistors MP3 and MP4 are turned off, and the differential unit 41 is disabled accordingly.

The MOS transistor MN5 comprises a first terminal coupled to a node ND2, a second terminal coupled to the transmission terminal OUTN and a control terminal coupled to the pre-driver 10C, and the MOS transistor MN6 comprises a first terminal coupled to the node ND2, a second terminal coupled to the transmission terminal OUTP and a control terminal coupled to the pre-driver 10C. The MOS transistors MN5 and MN6 are implemented as another differential pair, and the control terminals of the MOS transistors MN5 and MN6 serve as input terminals of the differential pair, and the second terminals of the MOS transistors MN5 and MN6 serve as output terminals of the differential pair. The current source I5 is coupled between the node ND2 and the ground voltage.

In the first transmission mode, the enabling signal EN is deactivated, and the switching circuit 43 pulls the control terminals of the MOS transistors MP3 and MP4 to the voltage V1. Accordingly, the MOS transistors MP3 and MP4 are turned off, such that the differential unit 41 is disabled. Simultaneously, the differential unit 42 (i.e., the MOS transistors MN5 and MN6 and the current source I5) acts as a current mode logic (CML) circuit (i.e., a first output driver) to output signals compatible with the first transmission interface according to the input signal IN3 from the pre-driver 10C. For example, according to the input signal IN3, one of the MOS transistors MN5 and MN6 is turned on and the other is turned off, such that the signals compatible with the first transmission interface can be output to the transmission terminals OUTN and OUTP. The first transmission interface can be a current mode logic (CML) interface, but is not limited thereto.

In the second transmission mode, the enabling signal EN is activated, such that the switching circuit 43 does not pull the control terminals of the MOS transistors MP3 and MP4 to the voltage V1 and electrically connects the control terminals of the MOS transistors MP3 and MP4 to the pre-driver 10C. Namely, differential units 41 and 42 are both enabled in the second transmission mode. At this time, the current steering circuit implemented by the current sources I4 and I5 and the MOS transistors MP3, MP4, MN5 and MN6 acts as a second output driver to output signals compatible with the second transmission interface according to the input signal IN3. For example, the MOS transistors MP3 and MN6 are turned on and the MOS transistors MP4 and MN5 are turned off to output a first logic state compatible with the second transmission interface to the transmission terminals OUTN and OUTP according to the input signal IN3. Alternatively, the MOS transistors MP3 and MN6 are turned off and the MOS transistors MP4 and MN5 are turned on to output a second logic state compatible with the second transmission interface to the transmission terminals OUTN and OUTP according to the input signal IN3. For example, the second transmission interface can be low voltage differential signaling (LVDS) interface, but is not limited thereto.

In some embodiments, the MOS transistors MN5 and MN6 can be thick-oxide native device or low threshold voltage device, such that operational speed of the multifunctional output driver 100B is not lowered by the threshold voltage of the MOS transistors MN5 and MN6. Moreover, the multifunctional output driver 100B can further comprise a termination resistor coupled between the transmission terminals OUTN and OUTP, such that impedance of the multifunction output driver 100B can be matched with a corresponding external receiving unit (not shown).

Because the entire current steering circuit (i.e., differential units 41 and 42) can output signals compatible with the LVDS interface in the second transmission mode and a portion of the current steering circuit (i.e., differential unit 42 only) can output signals compatible with the CML interface in the first transmission mode, it does not require two sets of output drivers and pre-drivers for two transmission modes and thus, a required chip area can be reduced. Further, because the pre-driver 10C is powered by the power voltage VDDC (i.e., core power voltage) rather than the power voltage VDDIO (i.e., I/O power voltage), it can be implemented by thin-oxide devices to further save chip area, and thus, less power consumption and high speed transmission can be obtained.

Figure 3:
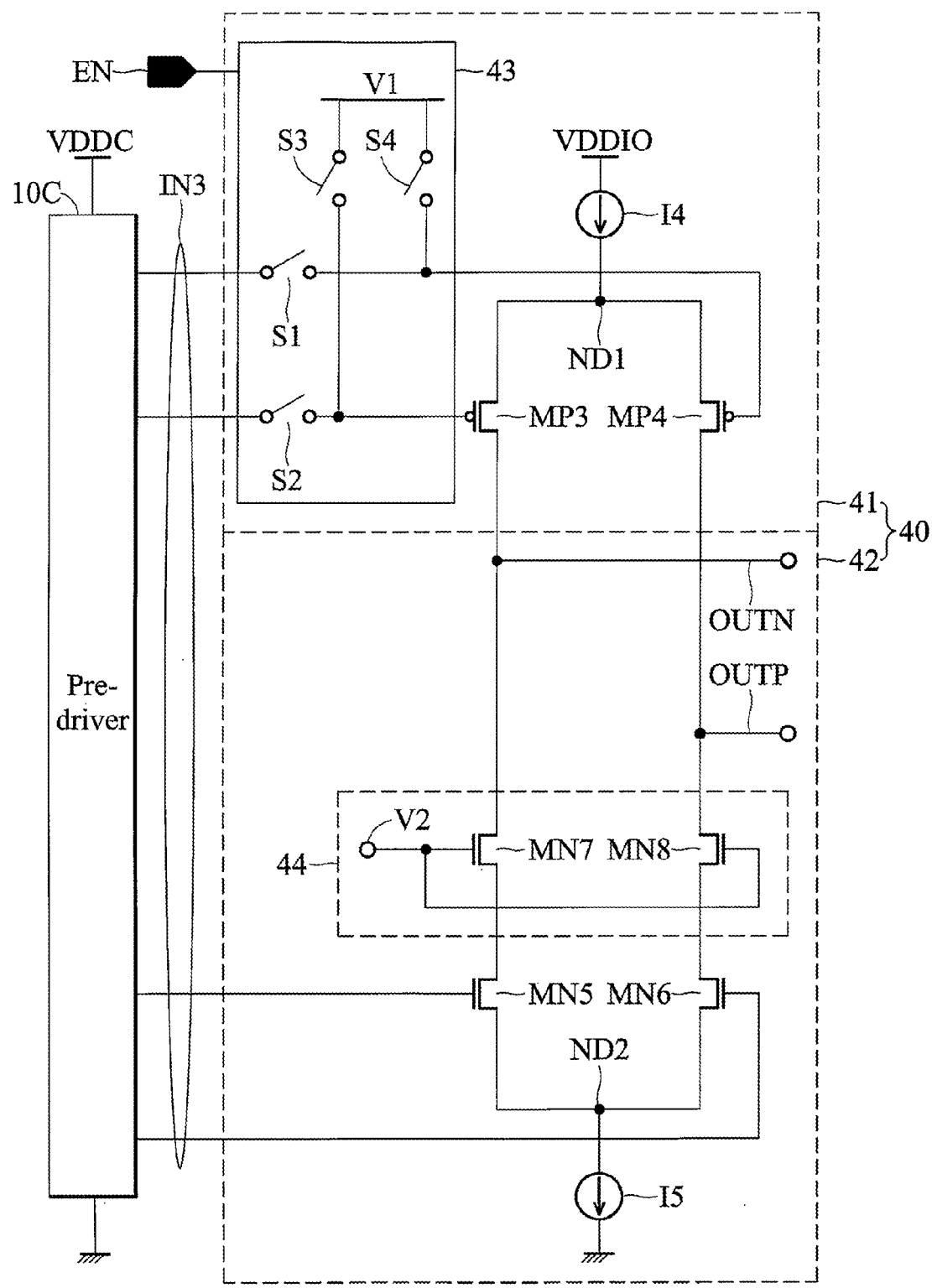
FIG. 3 shows another embodiment of a multifunctional transmitter.

FIG. 3 shows another embodiment of the multifunctional transmitter. As shown, the multifunctional transmitter 100C is similar to the multifunctional transmitter 100B in FIG. 2, differing only, in that a clamping device 44 is coupled between the transmission terminals OUTN and OUTP and the differential pair composed of the MOS transistors MN5 and MN6 to clamp potentials at the output terminals of the differential pair. The clamping device 44 comprises MOS transistors MN7 and MN8 biased by a voltage V2. The MOS transistor MN7 comprises a first terminal coupled to the transmission terminal OUTN, a second terminal coupled to the second terminal of the MOS transistor MN5, and a control terminal coupled to the voltage V2, and the MOS transistor MN8 comprises a first terminal coupled to the transmission terminal OUTP, a second terminal coupled to the second terminal of the MOS transistor MN6, and a control terminal coupled to the voltage V2.

For example, the MOS transistors MN5 and MN6 can be thin-oxide devices, and the MOS transistors MN7 and MN8 can be thick-oxide native devices or thick-oxide devices, but is not limited thereto. Further, the voltage V2 can be smaller than the power voltage VDDIO or VDDC, but is not limited thereto. Because of the MOS transistors MN7 and MN8, the MOS transistors MN5 and MN6 are not directly coupled to the power voltage VDDIO (i.e., I/O power voltage), thus preventing device breakdown causing shortened operating life-span. The detailed transmission operations of the multifunctional transmitter 100C are similar to that for the multi-functional transmitter 100B described above and thus are omitted for brevity.

Figure 4:
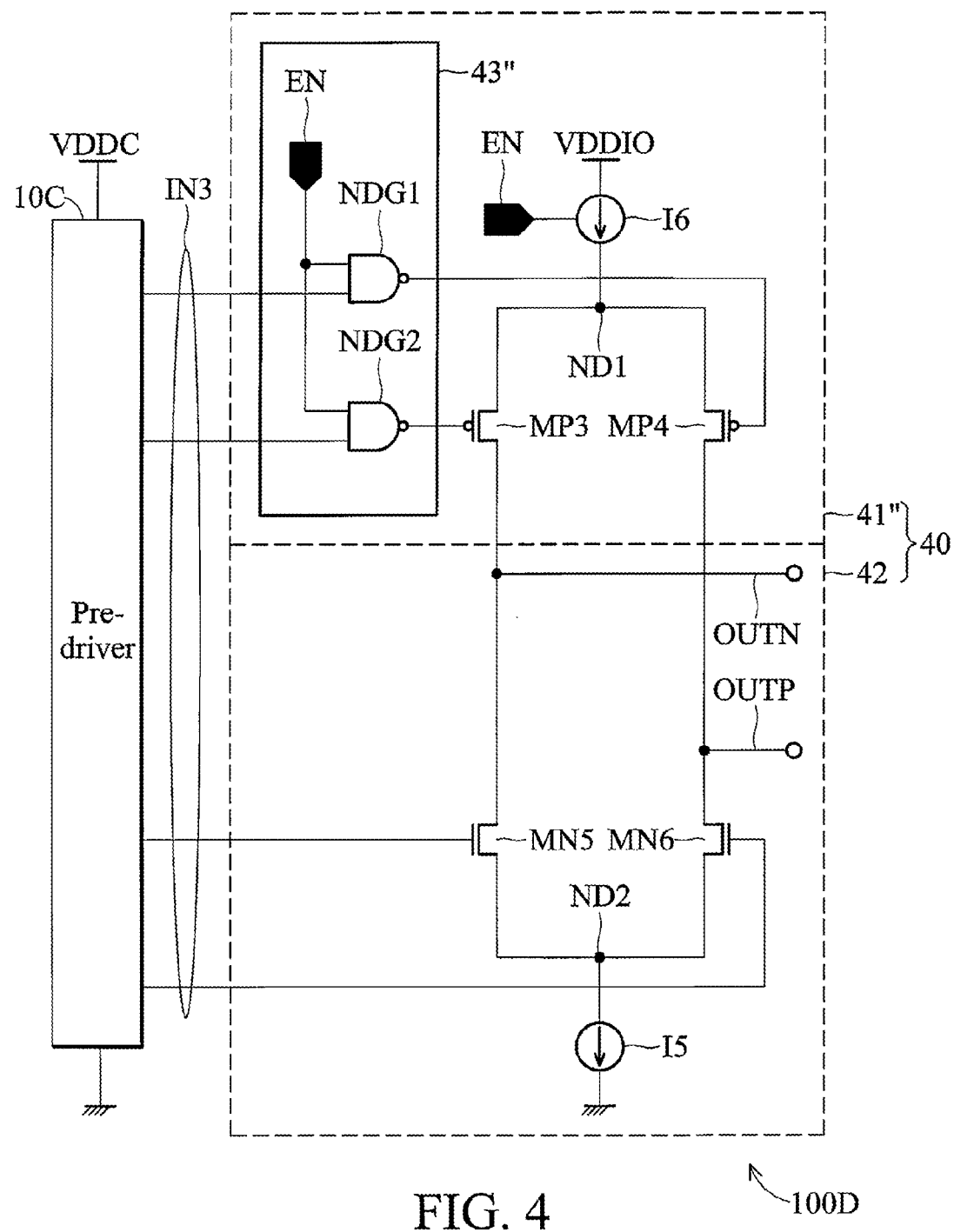
FIG. 4 shows another embodiment of a multifunctional transmitter.

FIG. 4 shows another embodiment of the multifunctional transmitter. As shown, the multifunctional transmitter 100D is similar to the multifunctional transmitter 100B in FIG. 2, differing only, in that a switching circuit 43" coupled to the pre-driver 10C. The control terminals of the MOS transistors MP3 and MP4 are controlled by two NAND gates NDG1 and NDG2 rather than the switching devices S1-S4, and a current source I6 is a variable current source controlled by the enabling signal EN rather than the fixed current source I4.

The switching circuit 43" selectively disables the differential unit 41" according to the enabling signal EN. For example, the switching circuit 43" disables the differential unit 41" in the first transmission mode, such that the differential unit 42 acts the first output driver to output signals compatible with the first transmission interface (i.e., CML interface). The NAND gate NDG1 comprises a first input terminal coupled to the enabling signal EN, a second input terminal coupled to the pre-driver 10C and an output terminal coupled to the control terminal of the MOS transistor MP4. The NAND gate NDG2 comprises a first input terminal coupled to the enabling signal EN, a second input terminal coupled to the pre-driver 10C and an output terminal coupled to the control terminal of the MOS transistor MP3.

In the first transmission mode, the enabling signal EN is deactivated, such that the NAND gates NDG1 and NDG2 pulls the control terminals of the MOS transistors MP3 and MP4 to a logic high (i.e., the power voltage), such that the MOS transistors MP3 and MP4 are turned off, and thus, the differential unit 41" is disabled. In addition, the current source I6 is also turned off when the enabling signal EN is deactivated. At this time, the differential unit 42 composed of the MOS transistors MN5 and MN6 and the current source I5 acts as a current mode logic (CML) circuit (i.e. the first output driver) to output signals compatible with the first transmission interface (i.e., CML interface) according to the input signal IN3 from the pre-driver 10C.

In the second transmission mode, the enabling signal EN is activated, such that the NAND gates NDG1 and NDG2 electrically connect the control terminals of the MOS transistors MP3 and MP4 to the pre-driver 10C instead of pulling the control terminals of the MOS transistors MP3 and MP4 to the logic high, such that the differential unit 41" is not disabled. Namely, differential units 41" and 42 are both enabled in the second transmission mode. At this time, the current steering circuit implemented by the current sources I4 and I5 and the MOS transistors MP3, MP4, MN5 and MN6 acts as the second output driver to output signals compatible with the second transmission interface (i.e., LVDS interface) according to the input signal IN3 from the pre-driver 10C.

Figure 5:
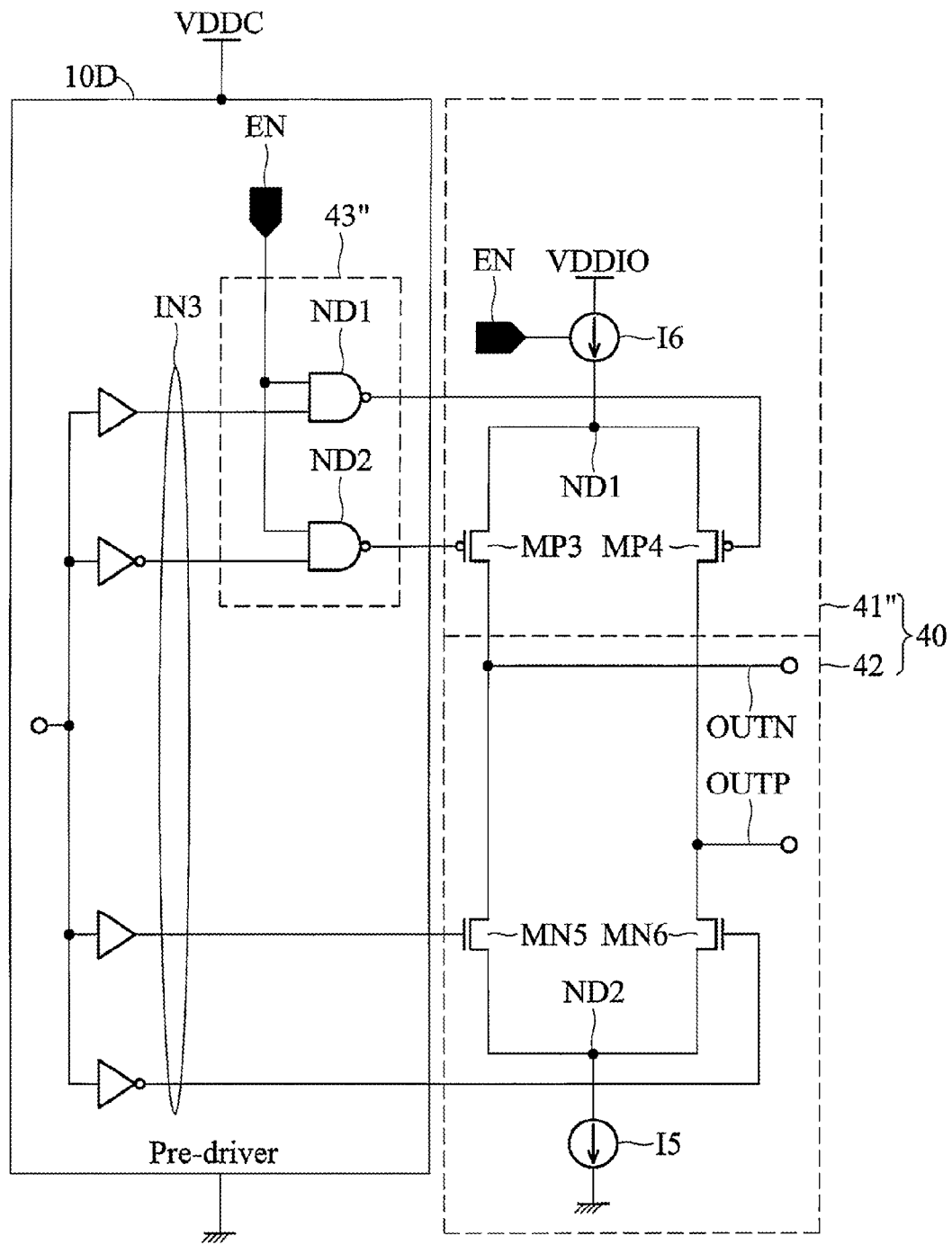
FIG. 5 shows another embodiment of a multifunctional transmitter.

FIG. 5 shows another embodiment of the multifunctional transmitter. As shown, the multifunctional transmitter 100E is similar to the multifunctional transmitter 100D in FIG. 4, differing only, in that the switching circuit 43" is integrated into the pre-driver 10C, i.e., the pre-driver 10C comprises the switching circuit 43" to selectively disable the differential unit 41". The detailed transmission operations of the multifunctional transmitter 100E are similar to that for the multifunctional transmitter 100D described above and thus are omitted for brevity.

In some embodiments, the switching circuits 43" in the multifunctional transmitter 100D and 100E can be omitted, and the differential units 41" are merely disabled by the current source I6. For example, when the enabling signal EN is deactivated in the first transmission mode, the current source I6 is turned off, such that the differential unit 41 or 41" is disabled. When the enabling signal EN is activated in the second transmission mode, the current source I6 is turned on, such that the differential unit 41 or 41 is enabled. The detailed transmission operations of such a multifunctional transmitter are similar to that for the multifunctional transmitters described above and thus are omitted for brevity. Further, the multifunctional transmitters of the embodiments of the invention can, for example, be applied in video processors or digital television (DTV) processors for electronic devices, such as mobile phones, display devices, PDAs, notebook computers and so on.

Certain terms are used throughout the description and claims to refer to particular system components. As one skilled in the art will appreciate, consumer electronic equipment manufacturers may refer to a component by different names. This document does not intend to distinguish between components that differ in name but not function.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. A multifunctional transmitter, comprising:
   a pre-driver powered by a first power voltage; and
   a multifunctional output driver powered by a second power voltage different from the first power voltage, wherein the multifunction output driver comprises:
   a first differential unit enabled in the first transmission mode to output the output signal compatible with a first transmission interface to a pair of transmission terminals according to an input signal from the pre-driver;
   a second differential unit disabled in the first transmission mode, wherein the first and second differential units are both enabled in the second transmission mode to output the output signal compatible with a second transmission interface to the transmission terminals according to the input signal from the pre-driver;
   wherein the pre-driver comprises a switching circuit to selectively disable the second differential unit according to an enabling signal.

2. The multifunctional transmitter as claimed in claim 1, wherein the first transmission interface is a current mode logic (CML) transmission interface and the second transmission interface is a low voltage differential signaling (LVDS) transmission interface.

3. The multifunctional output driver as claimed in claim 1, wherein the first differential unit comprises:
   a first differential pair coupled between a first node and the pair of transmission terminals, wherein the first differential pair comprises two input terminals coupled to the pre-driver, and a pair of output terminals is coupled to the pair of transmission terminals; and
   a first current source coupled between the first node and a ground voltage.

4. The multifunctional output driver as claimed in claim 1, wherein the second differential unit comprises:
   a second differential pair coupled between a second node and the pair of transmission terminals, wherein the second differential pair comprises two input terminals coupled to the pre-driver; and
   a second current source coupled between a the second power voltage and the second node and turned off in the first transmission mode when receiving the enabling signal.

5. The multifunctional transmitter as claimed in claim 1, wherein the second power voltage exceeds the first power voltage.

6. A multifunctional output driver comprising:
a first current source coupled between a second power voltage and a first node;
a first differential pair coupled between the first node and a pair of transmission terminals;
a second differential pair coupled between a second node and the pair of transmission terminals; and
a second current source coupled between the second node and a ground voltage,
wherein the first differential pair is disabled and the second differential pair and the second current source act as a first output driver to output an output signal compatible with a first transmission interface according to an input signal from a pre-driver in a first transmission mode, and the first and second current sources and the first and second differential pairs act as a second output driver to output an output signal compatible with a second transmission interface according to the input signal from the pre-driver in a second transmission mode, and the first current source is a variable current source turned off in the first transmission mode, wherein the pre-driver is powered by a first power voltage and the multifunctional output driver is powered by the second power voltage different from the first power voltage.

7. The multifunctional output driver as claimed in claim 6, wherein the first transmission interface is a current mode logic (CML) transmission interface and the second transmission interface is a low voltage differential signaling (LVDS) transmission interface.

8. The multifunctional output driver as claimed in claim 6, wherein the first current source is turned off when receiving an enabling signal in the first transmission mode.

9. The multifunctional output driver as claimed in claim 6, further comprising a switching circuit pulling input terminals of the first differential pair to a first voltage in the first transmission mode according to an enabling signal, such that the first differential pair is disabled.

10. The multifunctional output driver as claimed in claim 6, wherein the second power voltage exceeds the first power voltage.

11. A multifunctional transmitter, comprising:
a pre-driver powered by a first power voltage exceeding a ground voltage; and
a multifunctional output driver powered by a second power voltage exceeding the first power voltage, wherein the multifunction output driver comprises:
a first differential unit enabled in the first transmission mode to output the output signal compatible with a first transmission interface to a pair of transmission terminals according to an input signal from the pre-driver;
a second differential unit disabled in the first transmission mode, wherein the first and second differential units are both enabled in the second transmission mode to output the output signal compatible with a second transmission interface to the transmission terminals according to the input signal from the pre-drive.

12. The multifunctional transmitter of claim 11, wherein the first power voltage is a core power voltage, and the second power voltage is an I/O power voltage.

13. The multifunctional transmitter of claim 11, wherein the first transmission interface is a current mode logic (CML) transmission interface and the second transmission interface is a low voltage differential signaling (LVDS) transmission interface.

* * * * *